(12) United States Patent
Chen

(10) Patent No.: US 9,088,254 B2
(45) Date of Patent: Jul. 21, 2015

(54) DIFFERENTIAL-TO-SINGLE-END CONVERTER

(71) Applicant: MStar Semiconductor, Inc., Hsinchu Hsien (TW)

(72) Inventor: Hsin-Kuang Chen, Hsinchu County (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 14/321,988

(22) Filed: Jul. 2, 2014

(65) Prior Publication Data

US 2015/0015330 A1    Jan. 15, 2015

(30) Foreign Application Priority Data

Jul. 9, 2013    (TW) .............................. 102124538 A

(51) Int. Cl.
*H03F 3/45*    (2006.01)

(52) U.S. Cl.
CPC .. *H03F 3/45179* (2013.01); *H03F 2203/45364* (2013.01); *H03F 2203/45394* (2013.01); *H03F 2203/45646* (2013.01); *H03F 2203/45674* (2013.01)

(58) Field of Classification Search
USPC .................................. 330/301, 253, 263, 275
IPC .......................................................... H03F 3/04
See application file for complete search history.

(56) References Cited

U.S. PATENT DOCUMENTS

| 4,284,958 | A | * | 8/1981 | Pryor et al. | .................... | 330/253 |
| 5,844,442 | A | * | 12/1998 | Brehmer | ........................ | 330/258 |
| 7,944,246 | B2 | * | 5/2011 | Uchiki | .............................. | 327/58 |
| 8,994,452 | B2 | * | 3/2015 | Kim et al. | ........................ | 330/257 |
| 2010/0164625 | A1 | * | 7/2010 | Wong et al. | .................... | 330/255 |

* cited by examiner

*Primary Examiner* — Patricia T Nguyen
(74) *Attorney, Agent, or Firm* — WPAT, PC; Justin King

(57) ABSTRACT

A converter that converts a differential input signal to a single-end output signal is provided. The converter includes first, second, third and fourth transistors, and a pair of current sources. The first and second transistors are driven by the differential input signal, and have two conduction nodes coupled to each other and two conduction nodes not coupled to each other. The third and fourth transistors are driven by the differential input signal, and are connected in series with the first and second transistors. The pair of current sources, respectively connected in series with the third and fourth transistors, have a common control node coupled to the second conduction node of the first transistor. The second conduction node of the second transistor generates the single-end output signal.

13 Claims, 2 Drawing Sheets

US 9,088,254 B2

DIFFERENTIAL-TO-SINGLE-END CONVERTER

This application claims the benefit of Taiwan application Serial No. 102124538, filed Jul. 9, 2013, the subject matter of which is incorporated herein by reference.

BACKGROUND OF THE INVENTION

1. Field of the Invention

The invention relates in general to a differential-to-single-end converter, and more particularly to a converter that converts a differential input signal to a single-end output signal.

2. Description of the Related Art

To withstand noises from power lines and a semiconductor substrate, internal signals of an integrated circuit may be processed by a differential mode. For example, a ring oscillator often generates clock signals by a differential mode to prevent common mode noises from affecting the frequency.

However, a differential signal in the differential mode requires at least two signal transmission lines. Compared to one signal transmission line that a single-end signal requires, the design of the at least two signal transmission lines increases routing complexities and a pin count in an integrated circuit. As a result, signals of most logic circuits in an integrated circuits adopt the single-end mode, and only signals that demand a high noise resistance adopt the differential mode. A differential-to-single-end converter converts a differential input signal to a single-end output signal, and serves as a bridge between circuits of different signal modes.

Referring to FIG. 1, a conventional differential-to-single-end (D2S) converter 10 includes two NMOS transistors N1 and N2, and two PMOS transistors P1 and P2. The differential-to-single-end converter 10 may be regarded as a conventional differential amplifier. A non-inverted signal S-NON and an inverted signal S-INV that form a differential signal are respectively inputted at gates of the NMOS transistors N1 and N2. The PMOS transistors P1 and P2 form a current mirror, and have a common control node CON-O that connects to a drain of the PMOS transistor P1. The NMOS transistor N1 and the PMOS transistor P1 are connected in series between power lines VDD and VSS. The NMOS transistor N2 and the PMOS transistor P2 are connected in series between power lines VDD and VSS via an output node OUT. The output node OUT generates a single-end signal S-ONE.

A good differential-to-single-end converter is capable of quickly changing a logic value of its single-end signal as a logic value of a differential signal switches. Further, the differential-to-single-end converter also needs to a have a fast voltage slew rate. As such, when a differential clock signal provided by a ring oscillator is received to generate a single-end clock signal, a duty cycle of the single-end clock signal may approximate an ideal value of 50%.

SUMMARY OF THE INVENTION

According to an embodiment of the present invention, a converter that converts a differential input signal to a single-end output signal is provided. The converter includes first, second, third and fourth transistors, and a pair of current sources. The first and second transistors are driven by the differential input signal, and have two first conduction nodes that are coupled to each other and two second conduction nodes that are not coupled to each other. The third and fourth transistors are driven by the differential input signal, and are respectively connected in series with the first and second transistors. The pair of current sources are respectively connected in series with the third and fourth transistors, and have a common control node coupled to the second conduction node of the first transistor. The second conduction node of the second transistor generates the single-end input signal.

According to another embodiment of the present invention, a signal converting method for converting a differential signal to a single-end signal is provided. The differential signal includes a non-inverted signal and an inverted signal. The method includes: providing an output node that generates the single-end signal; providing a current source; controlling the current source according to the non-inverted signal; and conducting one of a discharging path and a charging path according to the inverted signal, and disconnecting the other of the discharging path and the charging path. When the differential signal is in a first logic value, the current source charges a signal output node via the conducted charging path; when the differential signal is in a second logic value, the output node is discharged via the conducted discharging path.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 2:
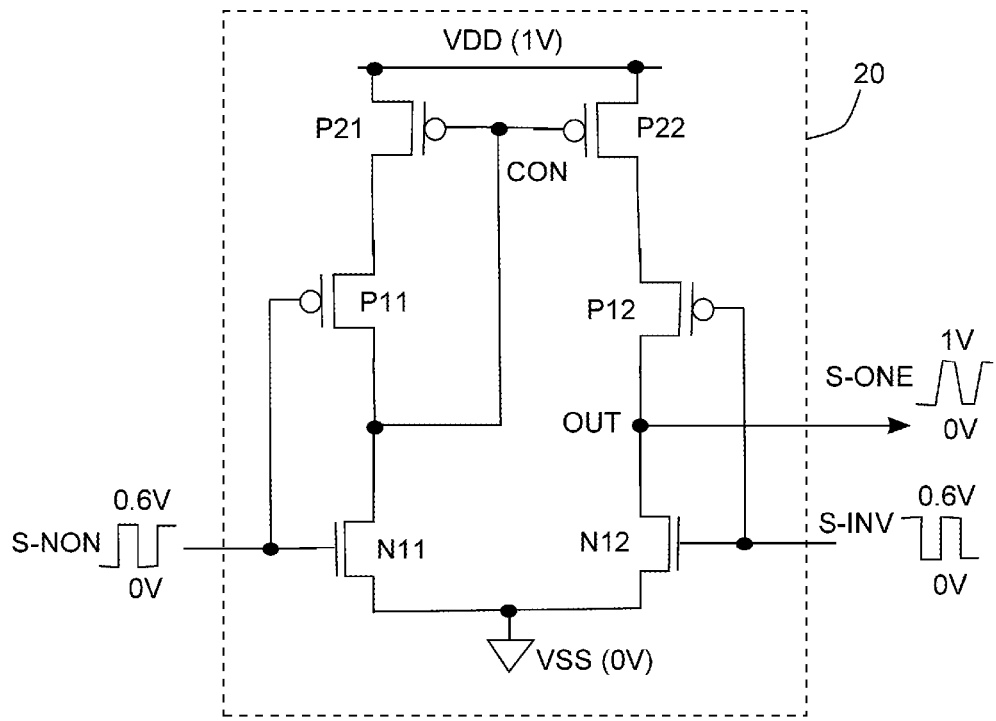
FIG. 2 and FIG. 3 are schematic diagrams of differential-to-single-end converters according to embodiments of the present invention.

FIG. 2 shows a differential-to-single-end converter 20 according to an embodiment of the present invention. As shown in FIG. 2, the differential-to-single-end converter 20 includes two NMOS transistors N11 and N12, and four PMOS transistors P11, P12, P21 and P22. In one embodiment, element sizes of the NMOS transistors N11 and N12 are substantially the same; element sizes of the PMOS transistors P11 and P12 are substantially the same; element sizes of the PMOS transistors P21 and P22 are substantially the same.

The NMOS transistors N11 and N12 are a differential pair, whose gates are respectively driven by a non-inverted signal S-NON and an inverted signal S-INV of a differential signal. The NMOS transistor N11 and N12 have their sources jointly coupled to a power line VSS, and their drains not coupled to each other. Operation statuses of the NMOS transistors N11 and N12 are complementary. For example, the NMOS transistor N12 is turned off when the NMOS transistor N11 is turned on, and vice versa.

The PMOS transistors P11 and P12 are another differential pair, whose gates are respectively driven by the non-inverted signal S-NON and the inverted signal S-INV of the differential signal. As shown in FIG. 2, the PMOS transistors P11 and P12 are respectively connected in series with the NMOS transistors N11 and N12. In FIG. 2, the operation statuses of the PMOS transistors P11 and P12 are complementary. In other words, the PMOS transistor P12 is turned off when the PMOS transistor P11 is turned on, and vice versa.

The PMOS transistors P21 and P22 may be regarded as a current source pair, whose gates are coupled to each other to serve as a common control node CON. The common control node CON is connected to the drain of the NMOS transistor N11, which is also the drain of the PMOS transistor P11. The PMOS transistors P21 and P22 are respectively connected in series with the PMOS transistors P11 and P12, and have their sources jointly coupled to a power line VDD.

The drain of the NMOS transistor N12, also the drain of the PMOS transistor P12, serves as a signal output node OUT that generates a single-end output signal S-ONE.

In operations of the example below, it is assumed that the power line VDD is 1.1V, the power line VSS is 0V, and voltages of the non-inverted signal S-NON and the inverted signal S-INV are not rail-to-rail but only change between 0V and 0.6V. It should be noted that the values in the above example are non-limiting to the present invention. When the voltages of the non-inverted signal S-NON and the inverted signal S-INV are respectively 0V and 0.6V, the logic value of the differential signal is "0". In contrast, when the voltages of the non-inverted signal S-NON and the inverted signal S-INV are respectively 0.6V and 0V, the logic value of the differential signal is "1".

When the differential signal is "0", the NMOS transistor N11 and the PMOS transistor P12 are turned off, and the NMOS transistor N12 and the PMOS transistor P11 are turned on. Thus, the signal output node OUT is pulled down to 0V by a discharging path provided by the turned on NMOS transistor N12, and the logic value of the single-end output signal S-ONE is "0". At this point, the common control node CON is equivalently coupled to the drain of the PMOS transistor P21, such that the PMOS transistors P21 and P22 form an equivalent current mirror. The PMOS transistors P21 and P22 serve as two charging current sources that charge the two drains of the PMOS transistors P21 and P22. As such, the voltages at the two drains and the common control node CON may be approximately 1V or slightly lower than 1V.

When the differential signal is to change from "0" to "1", the non-inverted signal S-NON starts rising from 0V, and the inverted signal S-INV starts dropping from 0.6V. Once the voltage of the non-inverted signal S-NON is higher than that of the inverted signal S-INV, the NMOS transistor N11 and the PMOS transistor P12 become turned on, whereas the NMOS transistor N12 and the PMOS transistor P11 become turned off. Since the PMOS transistor P11 is turned off, the PMOS transistor P21 serving as the charging current source cannot charge the common control node CON. Thus, the common control node CON is quickly discharged to 0V by a discharging path provided by the turned on NMOS transistor N11. Turning off the NMOS transistor N12 is equivalent to disconnecting the discharging path from the signal output node OUT to the power line VSS. At this point, the PMOS transistor P22 serves as a charging current source, and charges the signal output node OUT via the charging path provided by the turned on PMOS transistor P12. As the voltage at the common control node CON is 0V, the gate-to-source voltage of the PMOS transistor P22 is −1V, which is a maximum negative value in a system powered by the power line VDD and the power line VSS. Thus, the PMOS transistor P22 quickly charges the signal output node OUT by a maximum charging current, and eventually the single-output signal S-ONE has a voltage of 1V, and a logic value of "1".

When the differential signal is to change from "1" to "0", the non-inverted signal S-NON starts dropping from 0.6V, and the inverted signal S-INV starts rising from 0V. Once the voltage of the non-inverted signal S-NON is lower than that of the inverted signal S-INV, the NMOS transistor N12 and the PMOS transistor P11 become turned on, and the NMOS transistor N1 and the PMOS transistor P12 become turned off. At this point, the charging path provided by the PMOS transistor P12 is equivalently disconnected. The turned on NMOS transistor N12 provides a discharging path that discharges the signal output node OUT. As such, the single-end output signal S-ONE has a voltage that is quickly lowered from 1V to 0V, and a logic value of "0". Turning off the NMOS transistor N11 decouples the common control node CON from the power line VSS. The PMOS transistor P21 serving as a charging current source charges the common control node CON to approximately 1V-Vthp via the turned on PMOS transistor P11, where Vthp is a threshold voltage of the PMOS transistor P21. The PMOS transistor P22 serving as a charging current source charges the drain of the PMOS transistor P22 to approximately 1V and stops charging.

In the embodiment in FIG. 2, voltage swings of the non-inverted signal S-NON and the inverted signal S-INV are 0.6V, which is smaller than a voltage swing (1V) of the single-end output signal S-ONE. The non-inverted signal S-NON, the inverted signal S-INV and the single-end output signal S-ONE all have a low logic level of 0V. The non-inverted signal S-NON and the inverted signal S-INV have a high logic level of 0.6V, and the single-end output signal S-ONE has a high logic level of 1V.

Figure 1:
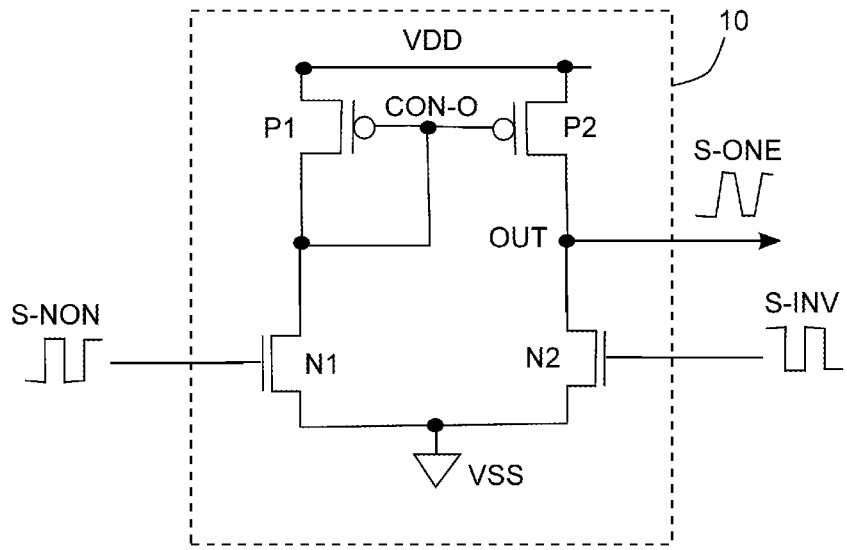
FIG. 1 is a conventional differential-to-single-end converter.

Given appropriate designs, the decrease slew rate and the increase slew rate of the single-end output signal S-ONE in FIG. 2 may be quite fast, and are higher than the decrease slew rate and the increase slew rate of the single-end output signal S-ONE in FIG. 1. When the differential signal in FIG. 2 is to change from "1" to "0", even when the charging current provided by the PMOS transistor P22 is temporarily not 0, the inverted signal S-INV first disconnects the charging path provided by the PMOS transistor P12 such that the signal output node OUT is discharged by only the NMOS transistor N12 and its voltage is quickly decreased. When the differential signal is to change from "0" to "1", since the inverted signal S-INV disconnects the discharging path provided by the NMOS transistor N12, and the charging path that the PMOS transistor P22 provides via the PMOS transistor P12 charges the signal output node OUT by a maximum value, the increase slew rate of the single-end output signal S-ONE is extremely fast.

When the differential signal in FIG. 2 is switched, the charging path or the discharging path for the signal output node OUT is quickly formed or disconnected. Therefore, the response speed of the single-end output signal S-ONE on the signal output node OUT is also quite fast.

Theoretically, the decrease slew rate and the increase slew rate of the single-end output signal S-ONE in FIG. 1 are slower than the results in FIG. 2. For example, when the differential signal in FIG. 1 is to change from "1" to "0", although the NMOS transistors N2 and N1 are respectively quickly turned on and turned off, the voltage at the signal output node OUT is not quickly decreased right from the beginning. Only when the common control node CON-O is charged to a substantial level and the charging current provided by the PMOS transistor P2 is lower than the discharging current provided by the NMOS transistor N2, the voltage at the signal output node OUT then slowly starts dropping. Therefore, the response speed and the decrease slew rate of the single-end output signal S-ONE in FIG. 1 are also smaller.

Similarly, when the differential signal in FIG. 1 is to change from "0" to "1", although the NMOS transistors N1 and N2 are respectively quickly turned on and turned off, the common control node CON-O cannot be as low as 0V as being limited by a MOS diode formed by the PMOS transistor P1. As a result, the charging current that the PMOS transistor P2 poses on the signal output node OUT cannot reach the possible maximum current of the PMOS transistor P2. Therefore, the increase slew rate of the single-end output signal S-ONE in FIG. 1 is also quite limited.

The single-end output signal S-ONE in FIG. 2 has an extremely fast response speed to the differential signal (formed by the non-inverted signal S-NON and the inverted signal S-INV), and also quite high increase/decrease slew rate. Therefore, when the duty cycle of the differential signal is 50%, given appropriate designs, the single-end output signal S-ONE in FIG. 2 can easily obtain a 50% duty cycle that substantially does not drift with semiconductor manufacturing parameters.

Figure 3:
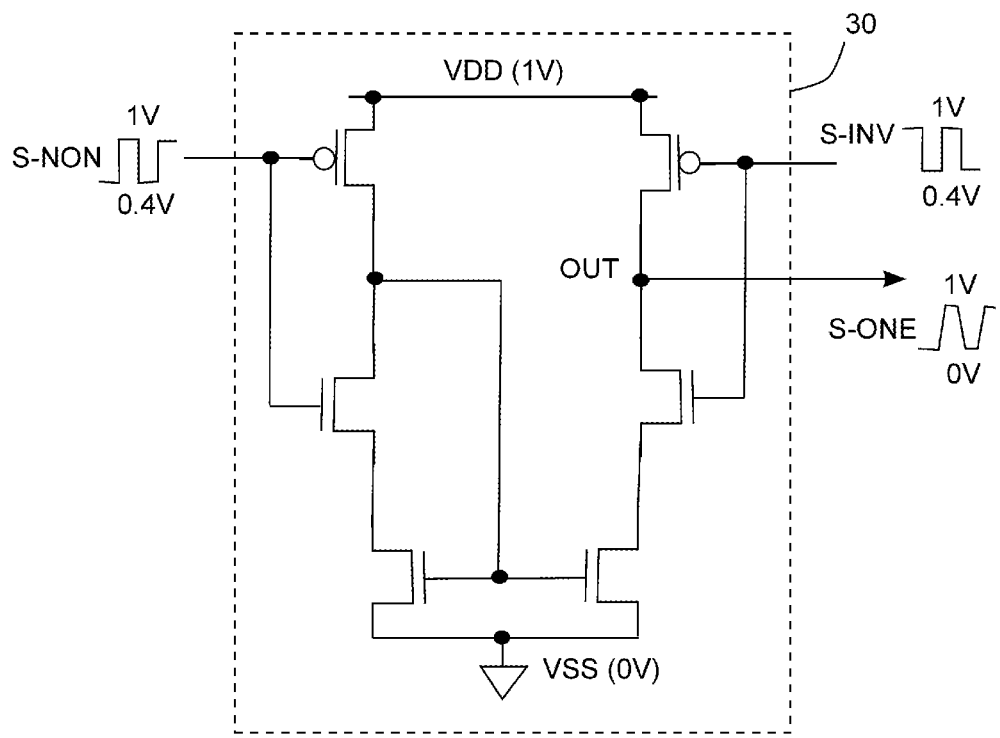

FIG. 3 shows a differential-to-single-end converter 30 according to another embodiment of the present invention. The differential-to-single-end converter 30 in FIG. 3 and the differential-to-single-end converter 20 in FIG. 2 are complementary. Operations and principles of the differential-to-single-end converter can be easily understood and deduced by one person skilled in circuit designs based on the teaching and description associated with FIG. 2, and shall be omitted herein.

Figure 4:
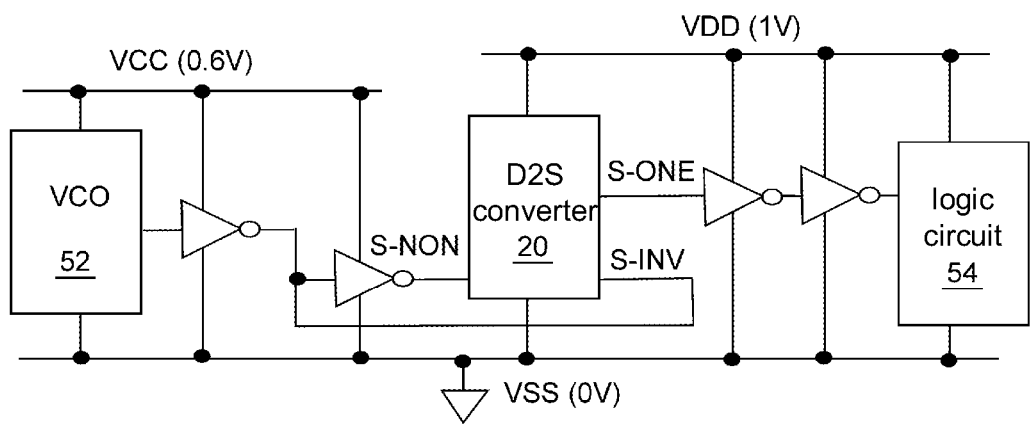
FIG. 4 is a schematic diagram of an integrated circuit applying a differential-to-single-end converter 20 in FIG. 2

FIG. 4 shows an integrated circuit applying the differential-to-single-end (D2S) converter 20 in FIG. 2. A voltage-controlled oscillator (VCO) 52 generates a clock signal. The clock signal is processed by two inverters respectively powered by a 0.6V power line VCC and a 0V power line VSS to generate a non-inverted signal S-NON and an inverted signal S-INV, which are fed into the differential-to-single-end converter 20, as shown in FIG. 4. The differential-to-single-end converter 20 generates a single-end output signal S-ONE having a 50% duty cycle. The driving capability of the single-end output signal S-ONE is reinforced by two inverters powered by a 1V power line VDD and a 0V power line VSS, and the reinforced single-end output signal S-ONE is fed into a logic circuit 54.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A converter, for converting a differential input signal to a single-end output signal, comprising:
   a first transistor and a second transistor, driven by the differential input signal, the first and second transistors having two first conduction nodes coupled to each other and two second conduction nodes not coupled to each other;
   a third transistor and a fourth transistor, driven by the differential input signal, respectively connected in series with the first and second transistors;
   a pair of current sources, respectively connected in series with the third and fourth transistors, having a common control node coupled to the second conduction node of the first transistor;
   wherein, the second conduction node of the second transistor generates the single-end output signal.

2. The converter according to claim 1, wherein the first and second transistors are first-type transistors, the third and fourth transistors are second-type transistors, and the first-type transistors and the second-type transistors are complementary.

3. The converter according to claim 1, wherein the pair of current sources comprise a fifth transistor and a sixth transistor respectively connected in series with the third and fourth transistors, and the fifth and sixth transistors have a common control node coupled to the second conduction node of the first transistor.

4. The converter according to claim 1, wherein operation statuses of the first and second transistors are complementary, and operation statuses of the third and fourth transistors are complementary.

5. The converter according to claim 1, wherein element sizes of the first and second transistors are substantially the same, element sizes of the third and fourth transistors are substantially the same, and element sizes of the pair of current sources are substantially the same.

6. The converter according to claim 1, further comprising a high-voltage power line and a low-voltage power line, wherein the two first conduction nodes of the first and second transistors are coupled to the low-voltage current line, and the pair of current sources are coupled to the high-voltage power line.

7. The converter according to claim 1, wherein the differential input signal is formed by a non-inverted signal and an inverted signal that respectively drive the first and second transistors.

8. The converter according to claim 7, wherein voltage swings of the non-inverted signal and the inverted signal are smaller than a voltage swing of the single-end output signal.

9. The converter according to claim 8, wherein the non-inverted signal, the inverted signal and the single-end output signal share a low-logic level.

10. A signal converting method, for converting a differential signal to a single-end signal, the differential signal comprising a non-inverted signal and an inverted signal, the method comprising:
    providing an output node that generates the single-end signal;
    providing a current source;
    controlling the current source according to the non-inverted signal; and
    conducting one of a charging path and a discharging path according to the inverted signal, and disconnecting one other of the charging path and the discharging path;
    wherein, when the differential signal is in a first logic value, the current source charges the output node via the conducted charging path; when the differential signal is in a second logic value, the output node is discharged via the conducted discharging path.

11. The signal converting method according to claim 10, wherein the step of controlling the current source according to the non-inverted signal comprises:
    controlling a control node of the current source to be coupled to a low-voltage power line according to the non-inverted signal, such that a charging current provided by the current source reaches a maximum.

12. The signal converting method according to claim 10, further comprising:
    controlling the current source to be approximately 0V according to the non-inverted signal when conducting the discharging path according to the inverted signal.

13. The signal converting method according to claim 10, further comprising:
    controlling the control node to be decoupled from a low-voltage power line according to the non-inverted signal when conducting the discharging path according to the inverted signal.

* * * * *